US008721786B2

(12) United States Patent
Andreaco et al.

(10) Patent No.: US 8,721,786 B2
(45) Date of Patent: May 13, 2014

(54) CZOCHRALSKI CRYSTAL GROWTH PROCESS FURNACE THAT MAINTAINS CONSTANT MELT LINE ORIENTATION AND METHOD OF OPERATION

(75) Inventors: Mark S. Andreaco, Knoxville, TN (US); Troy Marlar, Knoxville, TN (US); Brant Quinton, Knoxville, TN (US); Piotr Szupryczynski, Knoxville, TN (US)

(73) Assignee: Siemens Medical Solutions USA, Inc., Malvern, PA (US)

( * ) Notice: Subject to any disclaimer, the term of this patent is extended or adjusted under 35 U.S.C. 154(b) by 917 days.

(21) Appl. No.: 12/877,140

(22) Filed: Sep. 8, 2010

(65) Prior Publication Data

US 2012/0055395 A1    Mar. 8, 2012

(51) Int. Cl.
*C30B 15/26*    (2006.01)
(52) U.S. Cl.
USPC ............... 117/13; 117/15; 117/202; 117/217; 117/935
(58) Field of Classification Search
USPC .............................. 117/13, 15, 202, 217, 935
See application file for complete search history.

(56) References Cited

U.S. PATENT DOCUMENTS

| | | | |
|---|---|---|---|
| 4,511,428 A | 4/1985 | Ghosh et al. | |
| 4,591,994 A * | 5/1986 | Washizuka et al. | 117/15 |
| 5,269,875 A | 12/1993 | Sonokawa et al. | |
| 5,437,242 A | 8/1995 | Hoffstetter et al. | |
| 5,935,327 A | 8/1999 | Hariri et al. | |
| 6,136,090 A | 10/2000 | Araki et al. | |
| 6,325,851 B1 * | 12/2001 | Onoue | 117/202 |
| 7,204,881 B2 | 4/2007 | Hoshi et al. | |
| 7,329,317 B2 | 2/2008 | Maeda et al. | |
| 7,384,480 B2 | 6/2008 | Sugimura et al. | |
| 7,662,231 B2 | 2/2010 | Mühe | |
| 2002/0108558 A1 | 8/2002 | Hill et al. | |
| 2002/0144640 A1 | 10/2002 | Andreaco et al. | |
| 2006/0144320 A1 | 7/2006 | Korb | |
| 2007/0017435 A1 | 1/2007 | Takanashi | |
| 2009/0288591 A1 | 11/2009 | Ravi et al. | |
| 2010/0024718 A1 | 2/2010 | Orschel et al. | |
| 2010/0107966 A1 | 5/2010 | Javidi et al. | |

* cited by examiner

*Primary Examiner* — Bob M Kunemund
(74) *Attorney, Agent, or Firm* — Peter Kendall

(57) ABSTRACT

A Czochralski process ("CZ") crystal growth method and furnace having a heater capable of generating a heating zone, a crucible within the heating zone and capable of retaining a volume of molten crystal growth material forming a melt line oriented in a designated position within the heating zone, a seed growth rod retractable from the crucible with a rod retraction mechanism, for forming a crystal boule thereon proximal the melt line from the molten crystal growth material. The furnace causes relative movement between the crucible and heating zone as the crystal boule is retracted, so that the melt line is maintained in the designated position within the heating zone. In some embodiments relative movement is based at least in part on sensed weight of the growing crystal boule. In other embodiments the crucible growth rod retraction mechanism are fixed relative to each other by a gantry.

17 Claims, 5 Drawing Sheets

CZOCHRALSKI CRYSTAL GROWTH PROCESS FURNACE THAT MAINTAINS CONSTANT MELT LINE ORIENTATION AND METHOD OF OPERATION

BACKGROUND OF THE DISCLOSURE

1. Field of the Invention

The invention relates to furnaces implementing the Czochralski ("CZ") crystal growth process and methods operating same.

2. Description of the Prior Art

The Czochralski crystal growth technique is a commonly used method for industrial growth of rare earth oxyorthosilicates materials for photonic and electronic applications, including by way of nonlimiting example molecular imaging, homeland security and well logging industry applications. However, oxyorthosilicates while grown in the form of large single crystals become very susceptible to cracking, as may also display substantial nonuniformities in their optical and scintillation properties.

Cracking is a result of nonuniform thermal stress distribution in the volume of the crystal. The amount of thermal stress accumulated in the material depends strongly on values of thermal expansion coefficients usually measured along the main crystallographic axes. The differences between these coefficients in oxyorthosilicates may be very large. As a result, a substantial amount of stress is generated in the volume of the crystal during crystal growth and subsequent cooling processes. These stresses are amplified by differences in thermal gradients in a Czochralski furnace in both radial and axial directions. When thermal stresses exceed certain threshold values, the crystal releases accumulated internal stress energy and shatters.

Nonuniformities of crystal scintillation and optical properties are associated mostly with differences in the distributions of codopants and impurities in the volume of the material. Since most of the codopants and impurities accumulate on the surface of the melt during the growth process, any instability in the convection flow of the melt and disturbance of Marangoni flow will have a direct influence on the crystal composition.

Therefore, in order to minimize both the cracking effect and nonuniformity issues it is necessary to maintain continuous control over the thermal gradients in the crystal growth environment during the entire growth process.

Oxyorthosilicate crystals are usually grown in the form of long cylindrical boules, therefore temperature differences between the top and the bottom of the furnace should be maintained relatively low to avoid crystal cracking. However, relatively high thermal gradients between the crystal seed and the melt are necessary to inmate the growth process. Therefore, to achieve the optimal thermal environment in a Czochralski growth system, a common practice is to use afterheaters to control furnace axial gradients in the later stages of growth and cooling down processes. This solution requires a complicated and expensive double-coil RF crucible heating system, especially when used with high temperature growth processes. Moreover, in the traditional Czochralski furnace it is very difficult to control the behavior of the melt in the later stages of the growth process when convection flow of the melt and Marangoni flow are disturbed by a drop of the melt level in the crucible. It causes instabilities within the crystal-melt interface that affect the distribution of codopants in the volume of the crystal.

Thus, a need exists in the art for a Czochralski ("CZ") furnace that initially achieves high vertical thermal gradients in the crucible during the initial crystal formation process, so as to encourage crystal boule formation.

Another need exists in the art for a Czochralski ("CZ") furnace that after initial crystal formation alters its heating properties to enhance uniformity of radial thermal gradients and lower vertical thermal gradients in the crucible crystal/melt line interface, so as to reduce likelihood of crystal boule cracking as the boule grows.

Yet another need exists in the art for a Czochralski ("CZ") furnace that minimizes instabilities in the crystal codopant distribution within the crystal boule (that would otherwise negatively impact crystal scintillation and optical property uniformity) potentially caused by convection flow and Marangoni flow disturbance as the remaining melt volume in the crucible diminishes, without the need for additional superheating hardware in the RF heater.

SUMMARY OF THE INVENTION

Accordingly, an object of the invention is to create a CZ process crystal growth furnace that minimizes the likelihood of the crystal boule cracking and enhances crystal composition uniformity. This is to be accomplished by: (i) increasing vertical thermal gradients in the CZ furnace crucible melt during initial crystal formation; (ii) reducing those vertical gradients and enhancing radial thermal gradient symmetry during the remainder of crystal boule formation; and (iii) maintaining uniformity in convection flow and Marangoni flow in the crucible melt during the crystal formation process.

These and other objects are achieved in accordance with embodiments of the present invention modification of the Czochralski process growth furnace that enables better control of radial and axial thermal gradients during the growth process. The control of the thermal environment is achieved by synchronized relative movement between the crucible and heater during growth process so that the melt line level maintains a constant position relative to the heating zone generated by the heater RF coil. Relative movement synchronization may be enhanced by causing movement to be based at least in part on sensed weight of the crystal boule and/or fixing crucible and seed growth rod retraction rod relative orientations so that they move in tandem relative to the heater heating zone. In the present invention, the crucible itself performs the function of an afterheater at the later stages of the crystal growth by gradually reducing thermal gradients in the vertical direction to prevent a crystal boule from cracking. Conversely, in the initial stage of the growth process an embodiment of the present invention achieves high vertical thermal gradients necessary to initiate the growth process. Moreover, maintaining the crucible melt line level at the same position relative to the heater's heating zone generated by the RF coil improves the control over the melt behavior by producing uniform thermal gradients in the radial direction that stabilize the crystal-melt interface. An embodiment of the present invention allows one to grow crystal boules with relatively low cracking rate and uniformity of optical and scintillation properties throughout the boule.

An embodiment of the present invention features a Czochralski ("CZ") crystal growth furnace having a base; a heater capable of generating a generally annular shaped heating zone, coupled to the base; a pedestal moveable relative to the heating zone; and a pedestal motion driver coupled to the pedestal and base, for moving the pedestal relative to the heating zone. A crucible within the heating zone is coupled to the pedestal. The crucible is capable of retaining a volume of molten crystal growth material forming a melt line oriented in a designated position within the heating zone. A seed growth rod is retractable from the crucible, for forming a crystal boule thereon proximal the melt line from the molten crystal growth material. The melt line lowers within the crucible as the boule grows and is retracted. An optional weight sensor senses the boule weight. A pedestal motion controller coupled to the boule weight sensor and the pedestal motion driver causes pedestal movement relative to the heater that is based at least in part on sensed boule weight, so that the melt line maintains the designated position during boule growth and retraction.

An embodiment of the present invention also features an improved method for growing crystals with a Czochralski ("CZ") growth furnace by placing a crucible within a Czochralski growth furnace heater heating zone; maintaining a molten volume of crystal growth material forming a melt line in the crucible with the heater; and orienting the crucible melt line in a designated position within the heating zone. The method further includes retracting a crystal growth boule from the crucible with a seed rod, and thereby lowering the crucible melt line as the boule grows and consumes more of the crucible's melted contents. In an embodiment of the present invention, the boule weight optionally may be sensed and the melt line is maintained in the designated position within the heating zone by causing relative motion between the crucible and heater during the boule retracting step, based at least in part on sensed boule weight.

The objects and features of embodiments of the present invention may be practiced jointly or severally in any combination.

BRIEF DESCRIPTION OF THE DRAWINGS

The teachings of embodiments of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

After considering the following description, those skilled in the art will clearly realize that the teachings of embodiments of the invention can be readily utilized in CZ crystal growth furnaces so as to reduce the likelihood of crystal cracking or crystal non-uniformities in the finished boules.

Crystal Growth Furnace Description

Figure 1:
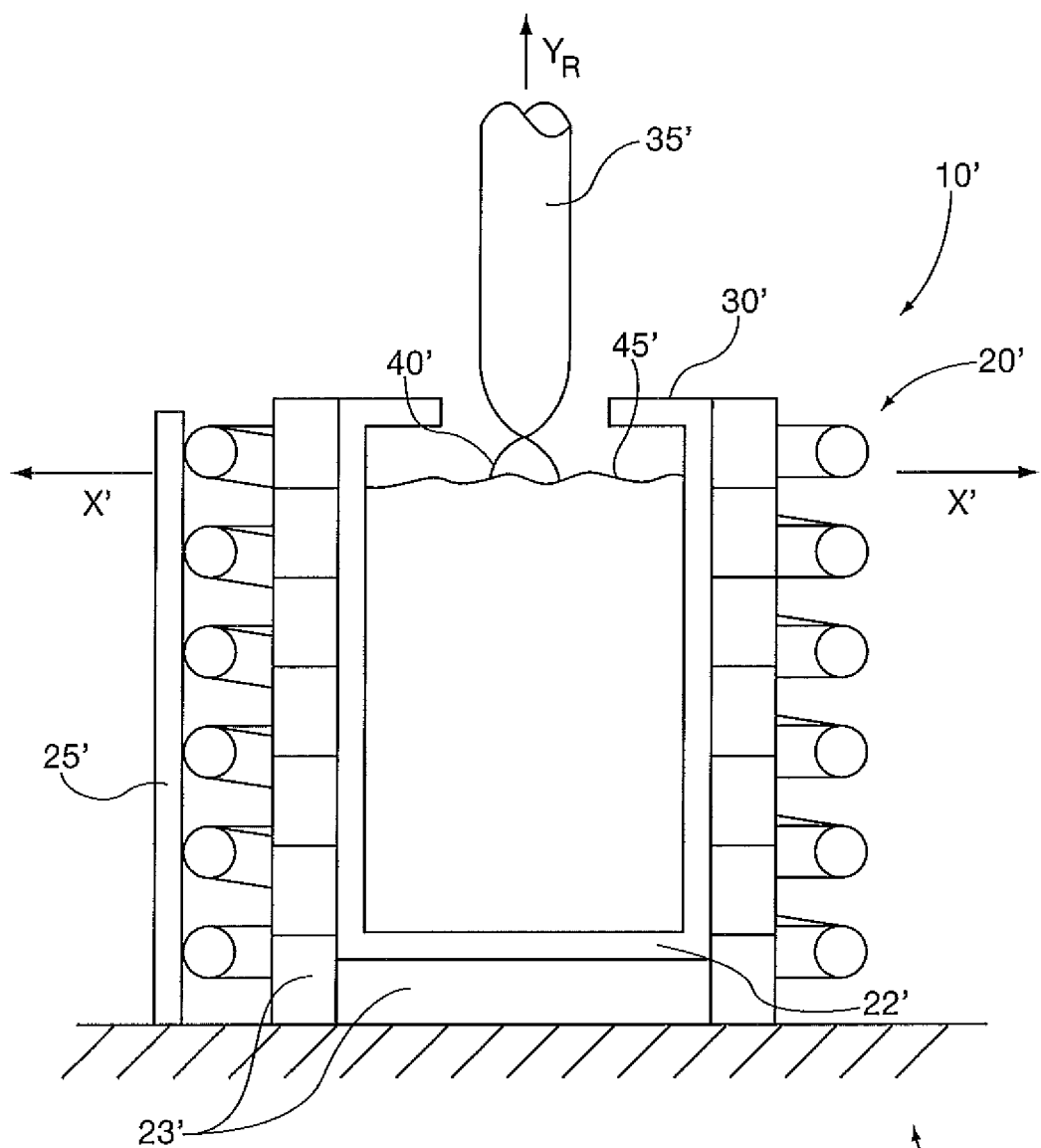
FIGS. 1 and 2 are schematic elevations of a prior art CZ furnace lowering of crucible molten content melt line level as a crystal boule is formed and retracted from the crucible.
Figure 2:
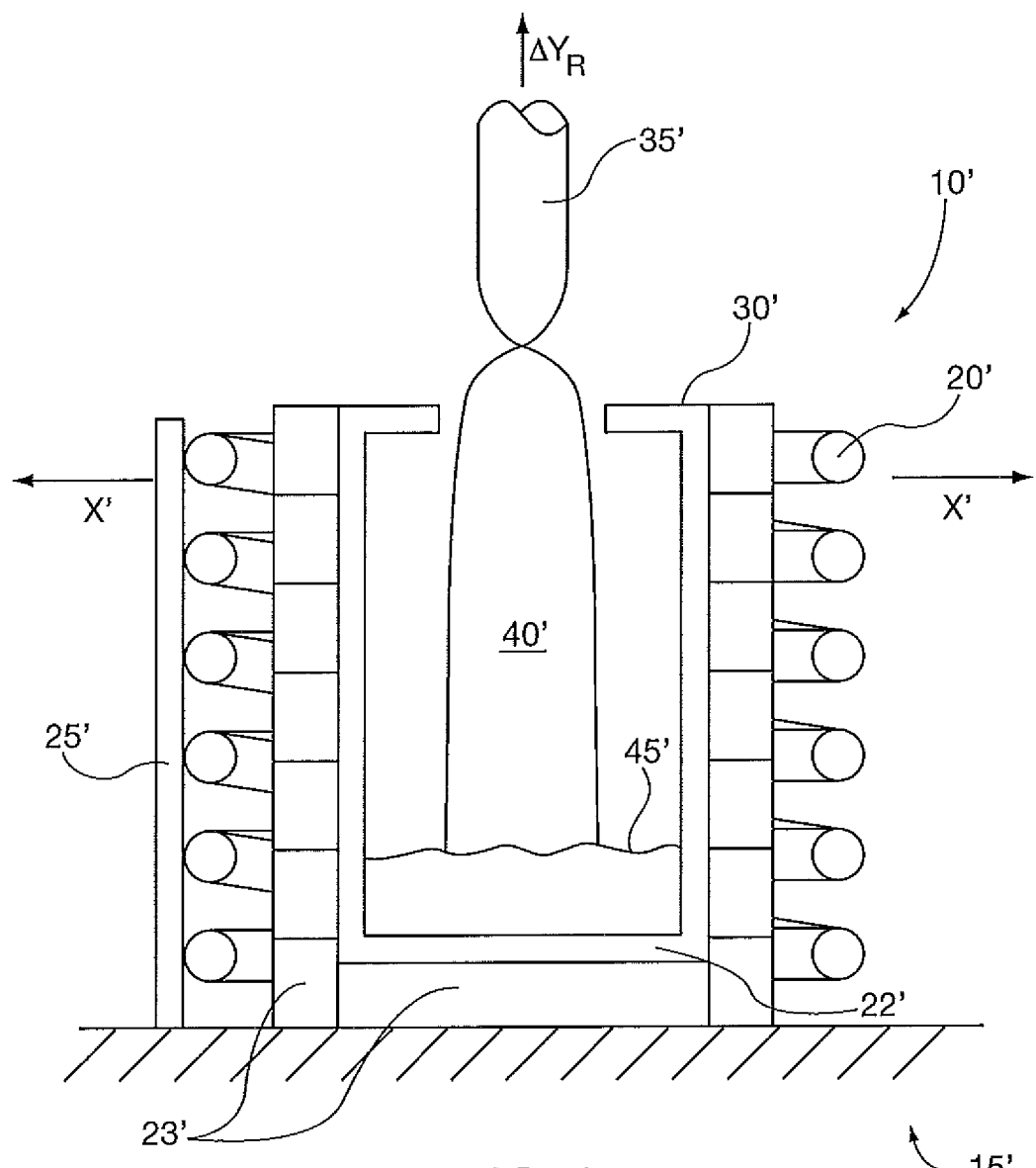
Figure 3:
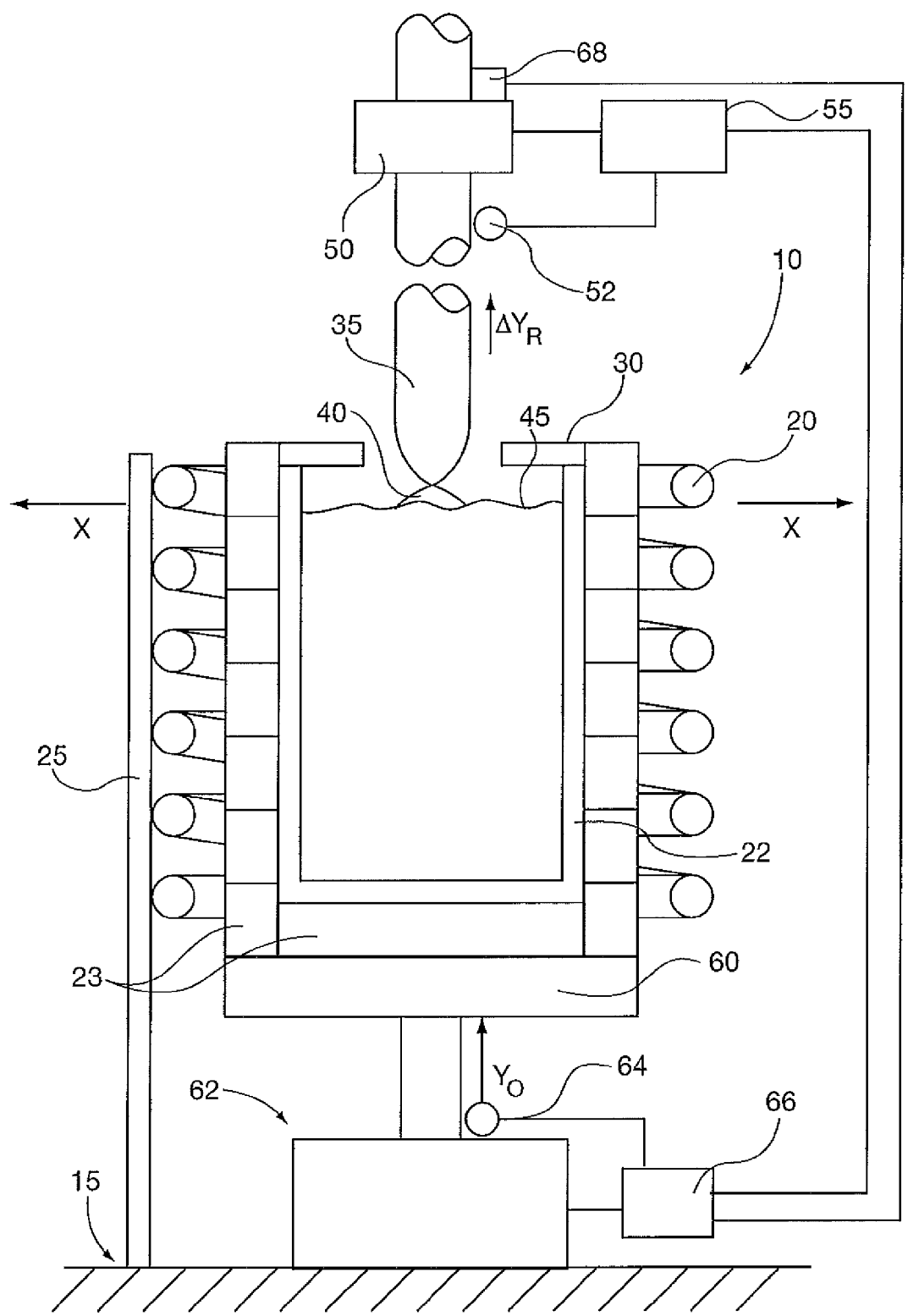
FIGS. 3 and 4 are schematic elevations, similar to those of FIGS. 1 and 2, of a CZ furnace in accordance with embodiments of the present invention for maintaining a constant melt line level relative to a desired designated position along line X-X as a crystal boule is formed and retracted from the crucible.
Figure 4:
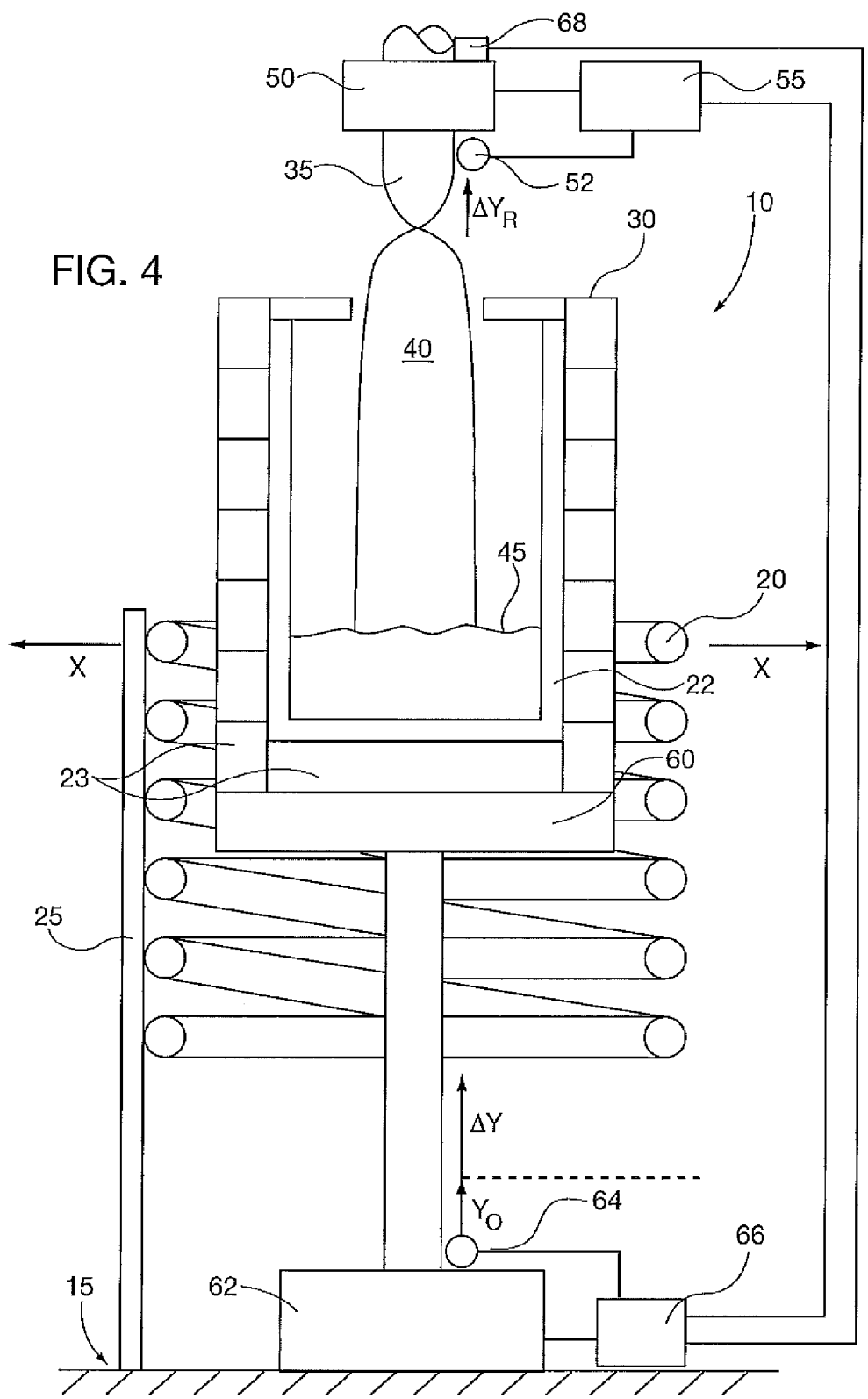

Referring to FIGS. 3 and 4, the crystal growth furnace apparatus 10 in accordance with an embodiment of the present invention has a base 15, a heating element 20, which may include by way of example a known RF heating element that defines a generally annular heating zone, and a heating element support 25 that couples the heating element to the base.

Crucible 22 is positioned within the heating zone of heating element 20, and is preferably surrounded circumferentially and along the bottom by an optional ceramic insulator 23. The crucible 20 includes a crucible lid 30 through which passes a retractable seed growth rod 35. The growth rod 35 retraction is accomplished by a seed rod retraction mechanism including a motion driver 50. A seed rod motion sensor 52 is communicatively coupled to seed rod motion controller 55 using known communication pathways and protocols. The seed rod motion controller 55 is communicatively coupled to the seed rod motion driver 50, and issues motion commands to the driver 50, based in part by seed rod position information provided by seed rod motion sensor 52, preferably in a motion control feedback loop.

A crystal boule 40 forms on the tip of the seed rod 35 in accordance with known growth methods, and grows into a boule, with the seed rod retracting in the Y direction designated by the arrow $\Delta Y_R$. Molten crystal formation material in the crucible 22 forms a melt line 45 at the top of the molten material. As the boule 40 grows and is extracted from the crucible molten material is consumed, thereby lowering the melt line 45 within the crucible. As was previously discussed herein, variation of the melt line 45 position within the heating zone can increase crystal boule 40 propensity to crack and/or develop material non-uniformities, rendering those portions unfit for intended final applications in finished products.

In accordance with an embodiment of the present invention, the melt line 45 is maintained at a constant position relative to the heating element 20 heating zone, designated by the reference line X-X, so as to reduce likelihood of crystal cracking or material non-uniformities during the growth process. Melt line 45 constant positioning is maintained by causing relative movement between the crucible 22 and heater 20 heating zone. The relative movement can be caused by movement of the crucible 22 with the insulator 23, the heater 20 or both. The movement may be based in at least part by the crystal boule weight, synchronized with crystal boule 40 retraction by the seed rod 35.

In the exemplary embodiments of the invention shown and described herein relative movement between the crucible 22 and heater 20 heating zone is accomplished by coupling the crucible and its insulator 23 to a moveable pedestal 60. Pedestal 60 motion is driven by crucible pedestal motion driver 62. Pedestal motion sensor 64 is communicatively coupled to pedestal motion controller 66 using known communication pathways and protocols. The pedestal motion controller is communicatively coupled to the pedestal motion driver 62, and issues motion commands to the driver 62, based in part by pedestal position information provided by pedestal motion sensor 64.

The seed rod controller 55 and the pedestal controller 66 are preferably in communication with each other and may be combined in a single controller that performs the functional responsibilities of the separate controllers 55 and 66. As the seed rod 35 is retracted a distance designated in FIGS. 3 and 4 by the arrow $\Delta Y_R$ pedestal controller 66 correlates seed rod retraction with depletion of molten crystal growth material and causes the pedestal motion driver 62 to raise the pedestal 60 so that the melt line 45 maintains a constant position along the designated axis X-X.

Optionally the melt line 45 position in the crucible can be estimated with a crystal boule weight sensor 68 employing known sensor technology that is coupled to the seed rod 35 retraction mechanism. Knowing the initial melt volume retained in the crucible 22, melt density properties and crystal boule weight determined by the weight sensor 68, one can estimate the volume of melt consumed by the growing boule, and by simple subtraction remaining melt volume. The melt line 45 location in the crucible 22 is a proportional function of the remaining melt volume and crucible solid geometry. Estimation of the melt line 45 as a function of crystal boule 40 weight is simpler to perform than by optical or other sensors viewing the melt line within a hot crucible during boule formation.

The weight sensor 68 is communicatively coupled to the pedestal controller 66, the controller utilizing the boule weight information at least in part to estimate accurately melt line position when determining pedestal 60 position correction commands to be issued to the pedestal motion driver 62. The pedestal controller can utilize any combination of available sensor information to determine pedestal 60 commission commands.

Figure 5:
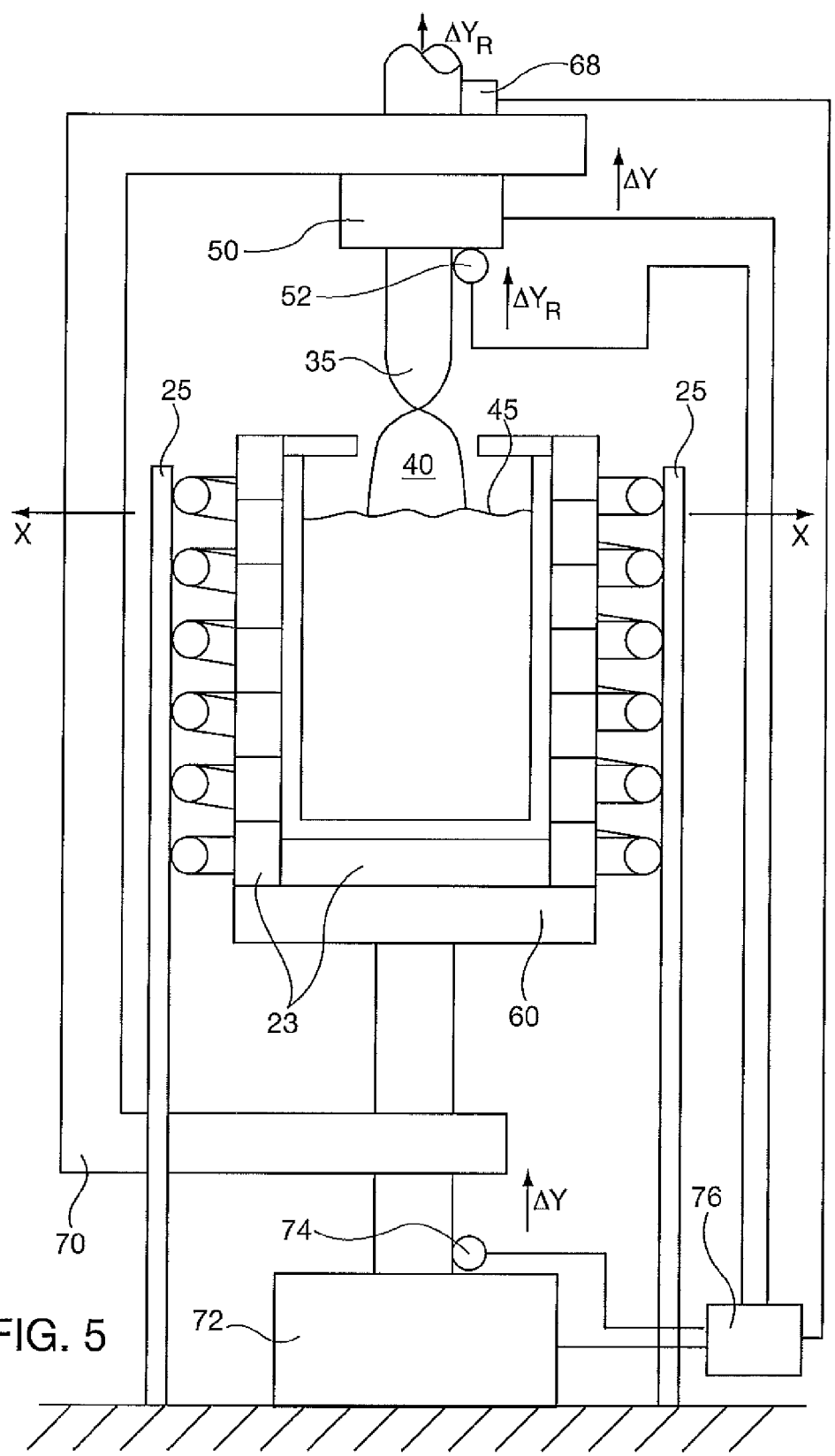
FIG. 5 is a schematic elevation, similar to FIGS. 3 and 4 showing an alternate embodiment of the present invention.

FIG. 5 shows an alternative embodiment of the present invention wherein the pedestal and seed rod are coupled by a common gantry 70 so that they have fixed orientations relative to each other that move in tandem relative to the heater 20 heating zone. Gantry 70 motion is sensed by gantry motion sensor 74 that is communicatively coupled to gantry controller 76. Gantry motion driver 72 moves the gantry 70/pedestal 60/seed rod 35 structure in response to commands issued by the ganry controller 76, as noted by the arrows ΔY. Gantry motion driver 72 and its related controls function similar to the pedestal motion driver 62 and its related controls that were previously described herein. Seed rod 35 motion $\Delta Y_R$ is performed through seed rod motion controller 50 and seed rod motion sensor 52 which are communicatively coupled to a controller, as was previously described herein. As shown in FIG. 5, in this exemplary embodiment the gantry controller 76 consolidates motion command and control for both the seed rod 35 and the gantry 70.

Crystal Growth Furnace Operation

In the beginning of the crystal growth process, the crucible 22 is oriented within the RF heater 20 in a position X-X that ensures the best electromagnetic and thermal coupling to the RF field generated by the heater. This achieves vertical thermal gradients preferable to initiate the crystal boule 40 growth process. As the crystal boule 40 is formed and drawn by the seed rod 35, the crystal volume increases and conversely the melt level 45 drops. The crucible 22 is elevated simultaneously with seed rod 35 retraction by the crucible motion driver 62. Alternatively, an embodiment of the present invention can be practiced by moving the heater 20 relative to the crucible 22. This relative movement of the crucible 22 and RF heater 20 is controlled by the crucible elevation motion controller 66. Crucible 22 synchronized elevation maintains constant orientation of the melt line 45 relative to the heater 20 RF coil, along X-X.

Heater 20/crucible 22 relative movement lowers efficiency of RF electromagnetic coupling between the crucible and the RF coil. The losses of the coupling efficiency are compensated by increasing power to the heater 20 RF generator during the entire crystal boule 40 growth process cycle. As beneficial result of the crucible 22/heater 20 relative movement and increase in heater 20 power application is a gradual temperature increase in the lower portion of the crucible 20, which aids and maintains active flow of the melt. Moreover, a partially empty crucible 22 radiates more heat to the upper part of the furnace growth chamber 10, which further reduces thermal gradients in the axial direction of the furnace.

By maintaining a relatively constant melt line position within the heating zone, thermal gradients around the growing crystal boule remain relatively constant. A radial symmetry of the crystal-melt interface thermal gradient and reduced vertical thermal gradients minimize the risk of crystal cracking during formation. This allows one to grow oxyorthosilicate crystals larger than in a known design CZ furnace with a stationary crucible/changing melt line position relative to the heating zone. Crystals grown utilizing the exemplary embodiment of the present invention may be grown to larger size, more of the melt can be consumed during crystal growth, and the final crystal product has higher uniformity of scintillation and optical properties.

Crystal Growth Example

A lutetium oxyorthosilicate crystal doped with $Ce^{3+}$ crystal boule was grown in a furnace in accordance with an embodiment of the present invention that practiced relative motion between the RF heater 20 and crucible 22, so as to maintain a constant melt line orientation with the heater's heating zone. The resultant boule 40 was sliced and thereafter light output, decay time and energy resolution (ER) were measured in the center of the slab section of the boule cut across the boule length, as shown in Table 1. Slabs were numbered starting from the bottom of the boule.

TABLE 1

| Slab # | Light Output | ER | Decay Time |
|---|---|---|---|
| 1 | 524 | 15 | 42.7 |
| 2 | 534 | 13 | 42.9 |
| 3 | 541 | 13 | 43.2 |
| 4 | 559 | 13 | 43.4 |
| 5 | 555 | 14 | 43.1 |
| 6 | 580 | 13 | 44.0 |
| 7 | 583 | 13 | 43.4 |
| 8 | 583 | 12 | 44.1 |
| 9 | 590 | 13 | 44.7 |
| 10 | 595 | 12 | 44.4 |
| 11 | 594 | 12 | 44.7 |
| 12 | 604 | 12 | 44.8 |
| 13 | 597 | 11 | 44.6 |
| 14 | 584 | 13 | 44.7 |

Although various embodiments which incorporate the teachings of the present invention have been shown and described in detail herein, those skilled in the art can readily devise many other varied embodiments that still incorporate these teachings.

What is claimed is:

1. A Czochralski ("CZ") crystal growth furnace comprising:
   a base;
   a heater capable of generating a generally annular shaped heating zone, coupled to the base;
   a pedestal moveable relative to the heating zone;
   a crucible within the heating zone and coupled to the pedestal, capable of retaining a volume of molten crystal growth material forming a melt line oriented in a designated position within the heating zone;
   a seed growth rod retractable from the crucible, for forming a crystal boule thereon proximal the melt line from the molten crystal growth material, the melt line lowering within the crucible as the boule grows and is retracted;
   a gantry coupling the pedestal and the seed growth rod in a fixed orientation relative to each other wherein the crucible is located between the seed growth rod and the pedestal and wherein movement of the gantry causes the seed growth rod and pedestal to move in tandem;
   a gantry motion driver coupled to the gantry and the base for moving the gantry;
   a boule weight sensor for sensing boule weight; and a gantry controller coupled to the boule weight sensor and the gantry motion driver, for causing movement of the gantry and thus pedestal movement relative to the heater based at least in part on sensed boule weight, so that the melt line maintains the designated position during boule growth.

2. The furnace of claim 1 further comprising a gantry motion sensor in communication with the gantry controller, the gantry controller causing gantry movement by the gantry motion driver at least based in part on gantry motion information received from the gantry motion sensor.

3. The furnace of claim 1, further comprising a seed rod motion driver coupled to the gantry and the seed growth rod for retracting the seed control rod from the crucible and a seed rod motion controller coupled to the seed rod motion driver, for causing seed rod retraction, the seed rod motion controller in communication with the gantry controller.

4. The furnace of claim 3, further comprising a seed rod motion sensor in communication with the seed rod motion controller, the seed rod motion controller causing seed rod movement by the seed rod motion driver at least based in part on seed rod motion information received from the seed rod motion sensor.

5. The furnace of claim 4, wherein the gantry and seed rod motion controllers communicate respective gantry motion and seed growth rod retraction motion information to each other.

6. The furnace of claim 3 wherein the pedestal gantry and seed rod motion controllers communicate respective gantry motion and seed growth rod retraction motion information to each other.

7. The furnace of claim 3 wherein the gantry and seed rod motion controllers are combined.

8. The furnace of claim 1, wherein the gantry controller causes gantry movement at least in part based on the sensed boule weight, boule diameter and melt density.

9. A Czochralski ("CZ") crystal growth furnace comprising:
a base;
a heater capable of generating a generally annular shaped heating zone, coupled to the base;
a pedestal moveable relative to the heating zone;
a crucible within the heating zone and coupled to the pedestal, capable of retaining a volume of molten crystal growth material forming a melt line oriented in a designated position within the heating zone;
a seed growth rod retractable from the crucible, for forming a crystal boule thereon proximal the melt line from the molten crystal growth material, the melt line lowering within the crucible as the boule grows and is retracted;
a gantry coupling the pedestal and the seed growth rod in a fixed orientation relative to each other wherein the crucible is located between the seed growth rod and the pedestal and wherein movement of the gantry causes the seed growth rod and pedestal to move in tandem;
a gantry motion driver coupled to the gantry and the base for moving the gantry;
a seed rod motion driver coupled to the gantry and the seed growth rod for retracting the seed control rod from the crucible and a seed rod motion controller coupled to the seed rod motion driver, for causing seed rod retraction, the seed rod motion controller in communication with the gantry controller;
a seed rod motion sensor in communication with the seed rod motion controller, the seed rod motion controller causing seed rod movement by the seed rod motion driver at least based in part on seed rod motion information received from the seed rod motion sensor;
a boule weight sensor for sensing boule weight;
a gantry controller coupled to the boule weight sensor and the gantry motion driver, for causing movement of the gantry and thus pedestal movement relative to the heater to be based at least in part on sensed boule weight as well as synchronized with boule extraction, so that the melt line maintains the designated position during boule retraction; and
a gantry motion sensor in communication with the gantry controller, the gantry controller causing gantry movement by the gantry motion driver at least based in part on gantry motion information received from the gantry motion sensor.

10. The furnace of claim 9, wherein the gantry controller causes gantry movement at least in part based on the sensed boule weight, boule diameter and melt density.

11. A Czochralski ("CZ") crystal growth furnace comprising:
a base;
a heater capable of generating a generally annular shaped heating zone, coupled to the base;
a pedestal, coupled to the base, moveable relative to the heating zone;
a crucible within the heating zone and coupled to the pedestal, capable of retaining a volume of molten crystal growth material forming a melt line oriented in a designated position within the heating zone;
a seed growth rod retractable from the crucible, for forming a crystal boule thereon proximal the melt line from the molten crystal growth material, the melt line lowering within the crucible as the boule grows and is retracted;
a gantry coupling the pedestal and the seed growth rod in a fixed orientation relative to each other wherein the crucible is located between the seed growth rod and the pedestal and wherein movement of the gantry causes the seed growth rod and pedestal to move in tandem;
a gantry motion driver coupled to the gantry and the base for moving the gantry;
means for retracting the seed growth rod from the crucible;
a boule weight sensor for sensing boule weight; and
means for causing movement of the gantry and thus pedestal movement relative to the heater based at least in part on boule weight, coupled to the boule weight sensor, and synchronized with the means for retracting the seed growth rod, so that the melt line is maintained at the designated position during boule growth.

12. An improved method for growing crystals with a Czochralski growth furnace, comprising:
placing a crucible within a Czochralski growth furnace heater heating zone;
providing a pedestal for moving the crucible;
maintaining a molten volume of crystal growth material forming a melt line in the crucible with the heater;
orienting the crucible melt line in a designated position within the heating zone;
retracting a crystal growth boule from the crucible with a seed rod coupled to a seed rod retraction mechanism, and thereby lowering the crucible melt line as the boule grows and consumes more of the crucible's melted contents;
maintaining a fixed relative orientation of the pedestal and seed rod retraction mechanism by coupling both to a gantry, wherein the crucible is located between the seed rod and the pedestal and wherein movement of the gantry causes the seed rod and pedestal to move in tandem; and maintaining the melt line in the designated position within the heating zone by causing relative motion between the crucible and heater during the boule retracting step.

13. A Czochralski ("CZ") crystal growth furnace comprising:
   a base;
   a heater capable of generating a generally annular shaped heating zone;
   a crucible oriented within the heating zone, capable of retaining a volume of molten crystal growth material forming a melt line oriented in a designated position within the heating zone;
   a pedestal coupled to and moveable relative to the base;
   a pedestal motion driver coupled to the pedestal and base;
   a seed growth rod retractable from the crucible with a seed rod retraction mechanism, for forming a crystal boule thereon proximal the melt line from the molten crystal growth material, the melt line lowering within the crucible as the boule grows and is retracted;
   a gantry coupling the pedestal and seed rod retraction mechanism in fixed relative orientation wherein the crucible is located between the seed growth rod and the pedestal and wherein movement of the gantry causes the seed growth rod and the pedestal to move in tandem; and
   a pedestal motion controller coupled to the pedestal motion driver, for relative motion between the heater and crucible, so that the melt line maintains the designated position during boule growth.

14. The furnace of claim 13 further comprising a pedestal motion sensor in communication with the pedestal motion controller, the pedestal controller causing pedestal movement by the pedestal motion driver at least based in part on pedestal motion information received from the pedestal motion sensor.

15. The furnace of claim 13, wherein the seed rod retraction mechanism comprises a seed rod motion driver coupled to the seed growth rod for retracting the seed control rod from the crucible, and a seed rod motion controller coupled to the seed rod motion driver, for causing seed rod retraction.

16. The furnace of claim 15, further comprising a seed rod motion sensor in communication with the seed rod motion controller, the seed rod motion controller causing seed rod movement by the seed rod motion driver at least based in part on seed rod motion information received from the seed rod motion sensor.

17. The furnace of claim 16, wherein the pedestal and seed rod motion controllers communicate respective pedestal motion and seed growth rod retraction motion information to each other.

* * * * *